United States Patent [19]

Pender

[11] Patent Number: 5,007,445

[45] Date of Patent: Apr. 16, 1991

[54] DYNAMIC FLOOD CONVEYOR WITH WEIR

[75] Inventor: Don P. Pender, Tempe, Ariz.

[73] Assignee: Advanced Systems Incorporated, Phoenix, Ariz.

[21] Appl. No.: 485,167

[22] Filed: Feb. 26, 1990

[51] Int. Cl.⁵ .............................................. B08B 3/04
[52] U.S. Cl. .............................. 134/122 R; 29/116.1; 118/404; 118/405; 118/414; 118/424; 134/902
[58] Field of Search ............ 134/122 R, 122 P, 64 R, 134/64 P, 902; 68/22 B, 43, 158, 175; 118/405, 407, 414, 419, 424, 429; 29/110, 116.1, 121.1

[56] References Cited

U.S. PATENT DOCUMENTS

| | | | |
|---|---|---|---|
| 1,455 | 12/1839 | Palmer | 29/116.1 X |
| 4,458,703 | 7/1984 | Inoue et al. | 134/64 R X |
| 4,724,856 | 2/1988 | Pender | 134/122 R |

Primary Examiner—Philip R. Coe
Attorney, Agent, or Firm—Tod R. Nissle

[57] ABSTRACT

A dynamic flood conveyor. The conveyor permits a chemical solution to be applied to the surface of a material such that the solution interacts with the material at a generally uniform rate at each point on the surface of the material. The apparatus promotes laminar flow of the channel solution over the surface of the material and uses segmented rollers to minimize the fluid loss from the flood conveyor.

3 Claims, 2 Drawing Sheets

DYNAMIC FLOOD CONVEYOR WITH WEIR

This invention relates to apparatus for applying chemical solutions to the surface of a piece of material.

More particularly, the invention relates to apparatus which permits a chemical solution to be applied to the surface of a material such that the solution interacts with the material at a generally uniform rate at each point on the surface of the material.

In a further respect, the invention relates to apparatus which permits a strip of circuit board substrate being transported by a conventional conveyor system to be totally immersed in a chemical bath which is supplied with a chemical solution by a closed circuit recirculation system.

In still another respect, the invention relates to apparatus of the type described in which the closed circuit system minimizes the formation of foam in the chemical solution.

In yet another respect, the invention relates to apparatus of the type which minimizes the loss of fluid from the bath which occurs when a strip of circuit board substrate passes through the bath.

The dynamic flood conveyor described in my U.S. Pat. No. 4,724,856 facilitates a uniform chemical reaction rate on a circuit board substrate by totally immersing the substrate in a chemical fluid reservoir or flood. Two disadvantages have been identified in utilizing the dynamic flood conveyor. First, when a relatively thick circuit board substrate passes through the dynamic flood conveyor, the substrate separates the rollers 13 and 35 and separates the rollers 18 and 36 (FIG. 1 of U.S. Pat. No. 4,724,856) permitting fluid to rapidly flow outwardly and escape from reservoir 43. Compensating for such rapid fluid loss typically requires a rapid influx of fresh fluid into the reservoir increasing the likelihood that unfavorable turbulent fluid flow conditions will occur in the reservoir. Second, the apparatus utilized in connection with the flood conveyor to capture used fluid which escaped from reservoir 43 was not especially well suited to effectively minimize the generation of foam in the used fluid.

Accordingly, it would be highly desirable to provide improved dynamic flood conveyor apparatus of the type described which substantially minimizes fluid loss from the reservoir when a circuit board substrate travels through the reservoir and which collects fluid which leeks from the reservoir and returns the fluid to the reservoir while minimizing or eliminating the formation of foam in the fluid during the collection and return of the fluid.

Therefore, it is a principal object of the invention to provide an improved dynamic flood conveyor apparatus for contacting the surfaces of a material with a chemical solution to promote the uniform chemical interaction of the solution at all points on the surface of a piece of material.

Another object of the invention is to provide an improved dynamic flood conveyor apparatus which minimizes fluid loss from the apparatus when circuit board substrate passes through the flood or reservoir in the apparatus.

A further object of the invention is to provide an improved dynamic flood conveyor apparatus which captures and recirculates back to the reservoir fluid which escapes from the reservoir and which minimizes the generation of foam in the fluid during such capture and recirculation.

These and other, further and more specific objects and advantages of the invention will be apparent to those skilled in the art from the following detailed description thereof, taken in conjunction with the drawings, in which:

FIG. 2 is an end view of the apparatus of FIG. 1 with a portion thereof broken away to further illustrate interior construction details thereof;

Figure 1:
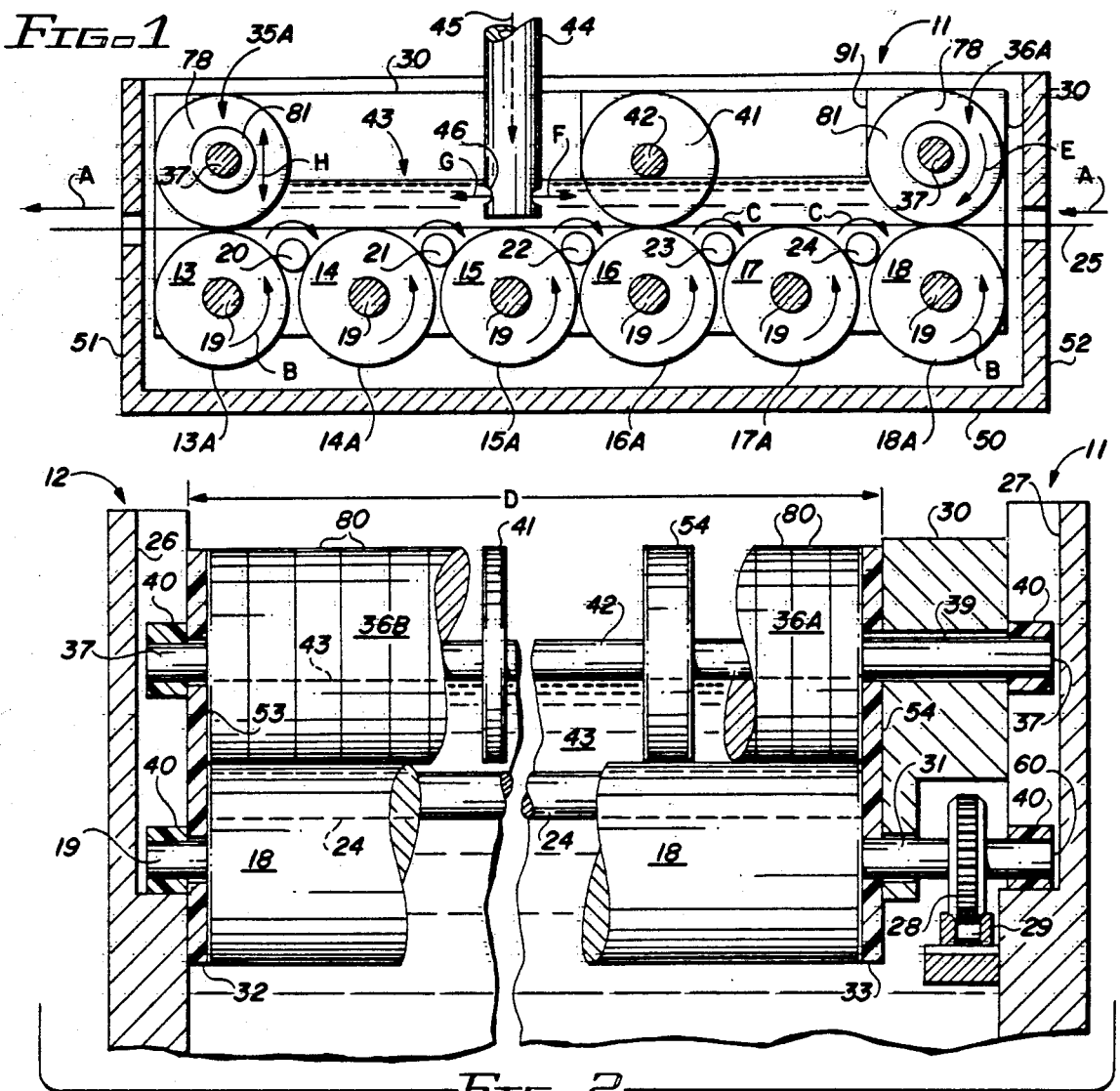
FIG. 1 is a front schematic view of dynamic flood conveyor apparatus constructed in accordance with the principles of the invention.

Briefly, in accordance with my invention, I provide a dynamic flood conveyor. The flood conveyor includes a pair of upstanding spaced apart side walls; generally horizontally oriented adjacent parallel support rollers for supporting and transporting said piece of material, the support rollers including first and second end rollers and a third roller intermediate the end rollers and spanning the space between the side walls, having first and second ends each rotatably mounted in one of the walls, and having a cylindrical outer surface spanning the space between the side walls, the uppermost portion of the cylindrical surface of the rollers each generally lying in and defining a common generally horizontal imaginary plane means for rotating each of the support rollers in a common direction; a plurality of lower fluid containment rollers each sealingly interposed between, continuously contacting and rotating on top of and intermediate the cylindrical surfaces of an adjacent pair of support rollers, and rotating in a direction opposite the common direction of rotation of the support rollers; a pair of upper fluid containment rollers each spanning the space between said side walls, having a pair of ends each rotatably mounted in one of the side walls, and positioned above and generally parallel to one of the first and second end rollers and continuously contacting at least one of a first contact pair, the contact pair comprising the cylindrical outer surface of one of the end rollers, and the upper surface of a piece of material passing between the upper fluid containment roller and the one of the end support rollers; a reservoir of fluid in the flood conveyor, the fluid reservoir generally being above the support rollers and the lower fluid containment rollers, being between the upper fluid containment rollers, and extending above the imaginary plane; at least on disk spaced apart from the side walls, and positioned above the third roller and continuously contacting and rotating over a portion of one of a second contact pair, the second contact pair comprising the cylindrical outer surface of the third roller, and the upper surface of a piece of material passing between and simultaneously contacting the upper disk and the third support roller. The disk prevents a piece of material passing between the disk and third roller from upwardly rising away from contact with the third roller and, for a piece of material passing between the disk and third roller, exposing to fluid in the reservoir the upper surface of the portion of the piece of material contacting the third roller and not contacting the disk. The flood conveyor also includes means for injecting fluid into the reservoir. At least one of the upper fluid containment rollers includes a generally horizontally oriented shaft and is segmented into a plurality of cylindrical segments, each of the segments having an aperture formed therethrough which circumscribes the shaft and is shaped and dimensioned to permit the segment to be vertically displaced with respect to the shaft.

Turning now to the drawings, which depict the presently preferred embodiments of the invention for the purpose of illustrating the practice thereof and not by way of limitation of the scope of the invention, and in which like reference characters refer to corresponding elements throughout the several views, FIGS. 1 and 2 illustrate a dynamic flood conveyor constructed in accordance with the principles of the invention and including upstanding side walls 11 and 12 and parallel support rollers 13-18 each having first 19 and second 60 ends rotatably mounted in one of side walls 11 and 12. Rollers 13 and 18 are the end rollers. The diameter of each roller 13-18 presently preferably equals that of the other rollers 13-18. Each roller 13-18 has a cylindrical outer surface 13A-18A. Rollers 13-18 support and transport a strip of material 25 through the dynamic flood conveyor in the direction of arrow A. Rollers 13-18 each turn in the direction indicated by arrows B. The ends 19 of each adjacent pair of support rollers 13-18 are presently equally spaced apart. Each end 19 is rotatably positioned in one of a series of parallel, vertical, spaced apart retainer slots 26 formed in wall 12. The width of a slot 26 is uniform along its length and is slightly greater than the outer diameter of a bushing 40 on an end 18. Similarly, each end 60 is rotatably positioned in one of a series of parallel, vertical, spaced apart retainer slots 27 formed in wall 11. The width of slot 27 is uniform along its length and is slightly greater than the outer diameter of a bushing 40 on an end 60. End 60 of each roller 13-18 carries a chain sprocket 28 fixedly attached thereto. A moving chain 29 engages and rotates each sprocket 28 and roller 13-18. Wall 11 includes side dam member 30 extending therealong. End 60 of each support roller 13-18 rotatably extends through an aperture 31 formed through side dam 30. Cylindrical low friction plastic washers 32 seal the space between each roller 13-18 and walls 11 and 12.

Elongate cylindrical lower fluid containment rollers 20-24 are interposed between and continuously contact and rotate on top of and intermediate the outer cylindrical surfaces 13A-18A of each adjacent pair of support rollers 13-18. For instance, lower fluid containment roller 20 is interposed between surfaces 13A and 14A of roller pair 13, 14. Fluid containment rollers 20-24 are rotated in the direction of arrows C by support rollers 13-18. Each fluid containment roller 20-24 is presently of a diameter slightly less than that which would cause the roller to protrude above a generally horizontal imaginary plane passing through substrate strip 25, and has a length less than the distance D between side wall 12 and side dam member 30. Each roller 20-24 substantially seals the cylindrical outer surfaces of an adjacent support roller 12-18 pair while generally not impeding the free rotation of the roller pair. Upper fluid containment rollers 35A and 36A are parallel to one another and are positioned above end rollers 13 and 18. The ends of shafts 37 of rollers 35A and 36A are each rotatably mounted in one of side walls 11 and 12. Cylindrical low friction plastic washers 53 and 54 seal the spaces between each roller 35, 36 and walls 11 and 12. One end of shaft 37 of roller 35A extends into a vertical slot 26 receiving end 19 of roller 13. The other end of shaft 37 of roller 35A extends into a vertical slot 27 receiving end 20 of roller 13. The diameter of each end of a shaft 37 is presently generally equivalent to the diameter of ends 19 and 60 of rollers 13-18. One end of shaft 37 of roller 35A rotatably passes through an aperture formed through side dam member 30 in the same manner as one end of shaft 37 on roller 36A does through aperture 39 in FIG. 2. The portions of each end 19, 20, and the ends of shafts 37 in a slot 26, 27 includes a bushing 40 secured thereto. One end of shaft 37 of roller 36A extends into vertical slot 26 which receives end 19 of roller 18. The other end of shaft 37 of roller 36A also extends into vertical slot 27 which receives end 60 of roller 18. End 38 of roller 36A rotatably extends through an aperture 39 formed in side dam 30. Rollers 35A and 36A contact rollers 13 and 18 or contact strip 25 passing over rollers 13 and 18. Motive power is transmitted from rollers 13 and 18 to rollers 35A, 36A and causes rollers 35A and 36A to turn in the direction indicated by arrow E.

Spaced apart disks 41 are fixedly attached to shaft 42. The ends of shaft 42 rotatably extend into vertical slots 26 and 27 which rotatably receive ends 19 and 60 of roller 16. The end of rod 42 extending into a slot 27 also rotatably passes through an aperture formed through side dam member 30 in the same manner aperture 39 is formed through member 30 for end of roller 36A. Disks 41 on shaft 42 contact the outer surface 16A of roller 16 or contact strip 25 traveling over roller 16. Motive power is transmitted from roller 16 to friction wheel 54 at the end of shaft 42 carrying disks 41 and causes disks 41 and shaft 42 to turn in the direction indicated by arrow E. Disks 41 prevent a strip of material 25 passing through the apparatus of FIGS. 1 and 2 from floating upwardly away from the uppermost portions of support rollers 13-18. The uppermost portions of rollers 13-18 lie in and define a horizontally oriented imaginary plan. In FIG. 1, strip of material 25 lies in this imaginary plane. The imaginary plane is, in FIG. 1, perpendicular to the plane of the paper of the drawings. Since lower fluid containment rollers 20-24 rotate in a direction which would cause rollers 20-24 to oppose the movement of strip 25 in the direction of arrow A, the diameter of rollers 20-24 is preferably small enough so that rollers 20-24 are each positioned beneath the imaginary plane intersecting the uppermost portions of rollers 13-18.

Fluid in reservoir 43 generally is above support rollers 13-18 and lower fluid containment rollers 20-24, is between upper fluid containment rollers 35 and 36, and extends above the imaginary plane extending through the uppermost portions of rollers 13-18.

During operation of the apparatus of FIGS. 1 and 2, fluid from reservoir 43 seeps between lower fluid containment rollers 2-24 and support rollers 13-18, and between upper fluid containment rollers 35A and 36A and rollers 13 and 18. Additional fluid 445 is introduced into reservoir 43 through at least one conduit member 44 having at least one nozzle mouth 46 positioned beneath the surface of reservoir 43. Fluid flows from nozzle mouth 46 in the directions of travel indicated by arrows F and G. The directions of flow F and G of fluid 45 into reservoir 43 are generally parallel to the imaginary plane intersecting the uppermost portions of rollers 13-18, are generally parallel to the planer surface of strip 25, and are generally parallel to the direction of travel A of strip 25 through the apparatus. Consequently, the introduction of fluid 45 into the reservoir 43 in the direction of arrows F and G promotes the uniform laminar flow of fluid over the upper surface of strip 25. Nozzle mouth 46 is presently preferably positioned above the pass line, i.e., above the upper surface of strip 25. The uniform laminar flow of fluid over the upper surface of strip 25 minimizes the formation of eddy currents in fluid reservoir 43 and therefore facilitates the transport of very thin substrate strips 25, and tends to eliminate "dead" areas of chemical interaction between fluid in reservoir 43 and strip 25. The flow rate of fluid 45 through conduit 44 into reservoir 43 is adjusted to compensate for and generally equal fluid losses from reservoir 43 during operation of the apparatus.

A nozzle mouth 46 can also, if desired, be positioned above the surface of reservoir 43. Mouth 46 can, regardless of the position of mouth 46 above or beneath the surface of reservoir 43, be shaped and dimensioned such that fluid flowing through mouth 46 travels radially outwardly away from nozzle 44 in any selected direction(s) of travel. Further, while the direction of travel of fluid emitted from mouth 46 and flowing away from nozzle 44 is presently preferably parallel to the imaginary plane lying in material 25 passing beneath nozzle 44, mouth 46 can also be shaped and dimensioned such that fluid emitted by mouth 46 flows upwardly away from and/or downwardly toward material 25.

The apparatus of the invention permits the use of solutions in reservoir 43 which contain a high quantity of surfactants. Solutions with a high quantity of surfactants are generally not suitable for use in spray treatment apparatus.

Side walls 11 are connected to a base 50 and end walls 51 and 52. Any suitable source of motive power can be utilized to drive chain 29.

The ends of shafts 37 of rollers 35A and 36A and the ends of shaft 42 "float" in their respective slots 26 and 27 and can be readily slidably displaced upwardly away from and then downwardly toward their respective support rollers in the directions indicated by arrows H. This permits rollers 35A and 36A and disks 44 to be upwardly displaced away from their respective operatively associated support rollers when a strip of material 25 is fed through the apparatus.

Figure 3:
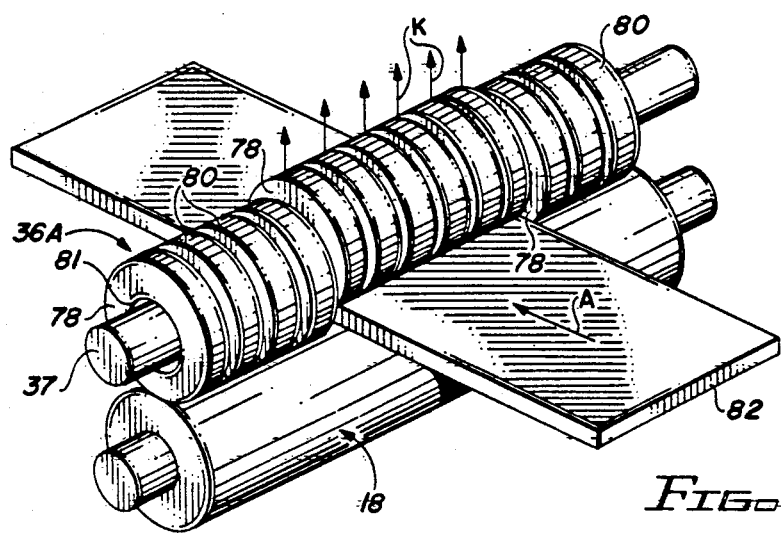
FIG. 3 is a perspective view illustrating a segmented roller utilized in the apparatus of FIGS. 1 and 2.
Figure 4:
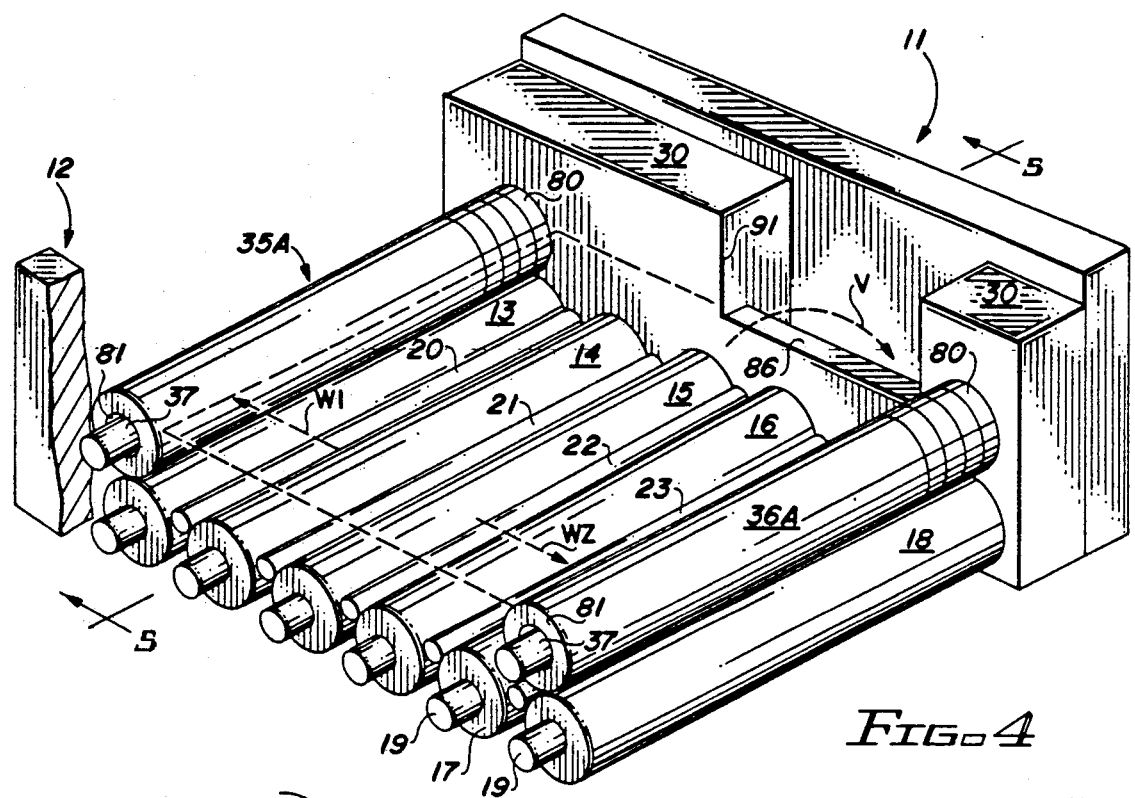
FIG. 4 is a perspective view of the apparatus of FIG. 1 with a portion thereof broken away to further illustrate construction details thereof; and, FIG. 5 is a section view further illustrating the apparatus of FIG. 4 and taken along section line 5—5 thereof.
Figure 5:
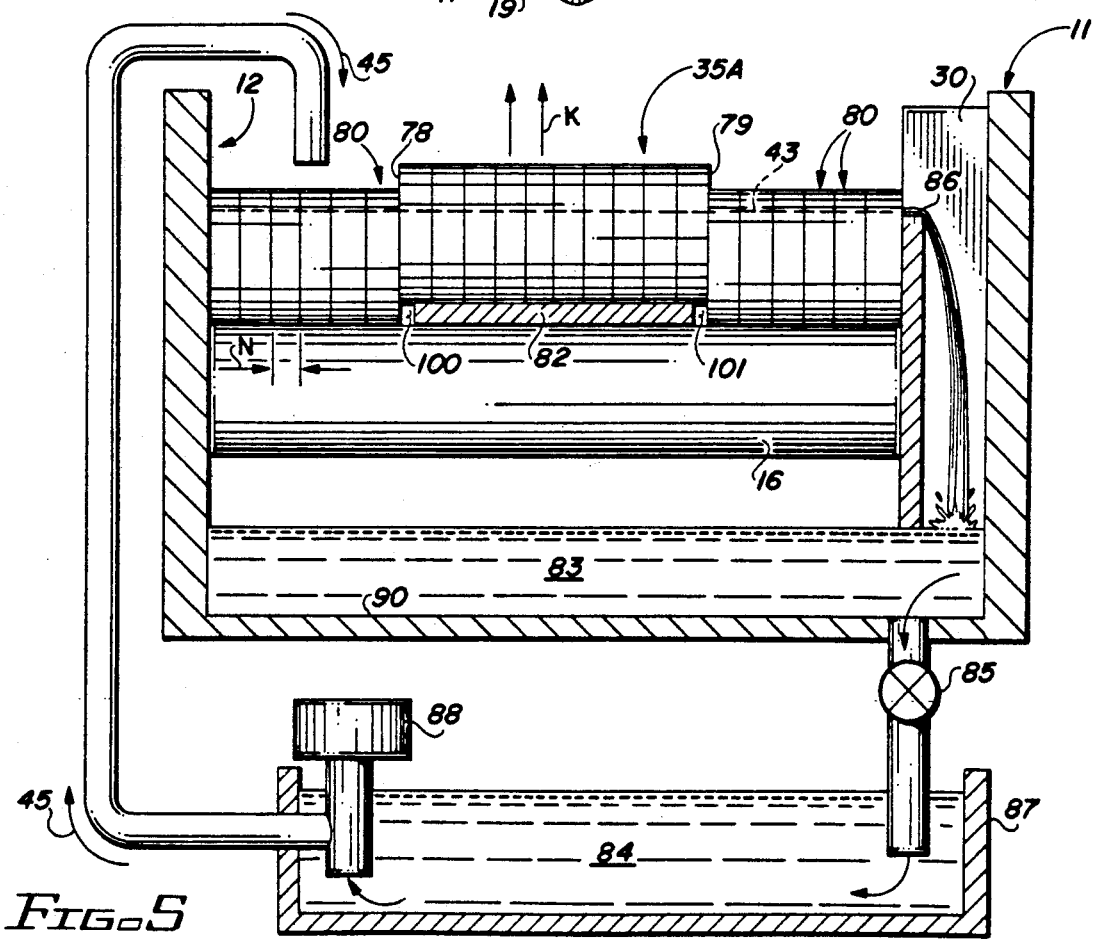

Rollers 35A and 36A are each segmented into a plurality of cylindrically shaped segments 80. Each segment 80 has a shape and dimension equal to the other remaining segments 80. Each segment 80 includes a pair of planar, spaced apart, parallel side faces 78 and 79. Faces 78 and 79 each have a circular peripheral edge and are of equal shape and dimension. Cylindrical aperture 81 extends through each segment 80 and interconnects faces 78 and 79. Each segment 80 touches at least one immediately adjoining segment 80. In particular, the face 78 of one segment slidably contacts the face 79 of an immediately adjoining segment. In FIGS. 4 and 5 the segments are drawn in their normal adjoining relationship. In FIG. 3, segments 80 are drawn with a small space in between each adjoining pair of segments 80. These small spaces do not exist during use of the apparatus of the invention, and are incorporated in FIG. 3 to emphasize that each segment 80 preferably is not connected to adjoining segments 80.

In FIGS. 1, 3 and 5, segments 80 and 81 are, for the sake of clarity, shown centered around and on shafts 37. Apertures 81 are spaced away from shafts 37. Under actual operating conditions, the weight of segments 80, the weight shafts 37, the force W1 and W2 of the fluid in the reservoir bearing outwardly against rollers 35A and 36A, and the rotational forces acting on segments 80 cause the rollers 35A and 36A to move outwardly away from one another and downwardly against a roller 13 or 18 such that apertures 81 contact shaft 37. When a circuit board substrate or other workpiece 82 moves between rollers 36A and 18 (and between rollers 35A and 13), the segments 80 contacting the workpiece 82 are upwardly displaced in the direction indicated by arrows K in FIGS. 3 and 5. Apertures 81, which have an inner diameter larger than the outer diameter of shafts 37 and free floating shaft 37, enable this upward displacement of segments 80 in FIGS. 3 and 5. The segments 80 which do not contact workpiece 82 remain in contact with roller 18. After workpiece 82 has moved completely through rollers 36A and 18 and lost contact with any segments 80, the segments 80 which contacted the workpiece 82 return to the position indicated in FIG. 2, contacting roller 18. The faces 78 and 79 of segments 80 must slidably move over one another such that when workpiece 82 moves between rollers 36A and 18 (or roller 35A and 13), only the segments 80 contacting workpiece 82 are upwardly displaced in the direction of arrows K from contact with roller 18. For example, in FIG. 5 the upwardly displaced segment 80 which is the furthest to the left of the segments 80 contacting 82 slidably moved upwardly over face 79 of the adjoining segment 80 to its left and said adjoining segment 80 remained in contact with roller 13 (roller 13 is not visible in FIG. 5).

FIGS. 4 and 5 illustrate the weir overflow system utilized in the invention to minimize the formation of foam in the closed circuit liquid recirculation system. The normal fluid level in the apparatus of the invention is indicated by dashed lines 43 in FIGS. 2, 4 and 5. As indicated by the different elevations of the dashed lines 43 in the drawings, the depth of liquid in the flood can vary as desired. The depth of liquid in the flood is preferably sufficient to minimize turbulence caused on the surface of the workpiece 82 by liquid returned to the bath through mouth 46 and is sufficient to assist in generating on segments 80 of forces indicated by arrows W1 and W2 in FIG. 4. Fluid being returned to the flood is indicated by arrows 45 in FIGS. 1 and 5. The fluid flow 45 into the flood is sufficient to compensate for fluid losses which occur through small apertures 100 and 101 (FIG. 5) between a workpiece 82 and adjacent segments 80 which are still in contact with roller 16. The fluid flow 45 is also sufficient to maintain fluid flowing out of the flood over weir 86 into sump 90. Valve 85 controls the rate at which fluid from sump 90 flows under gravity to sump 87. Pump 88 returns 45 fluid from sump 87 to the flood intermediate rollers 35A and 36A. Any foam which formed when fluid flowing over weir 86 flowed into sump 90 tends to remain on the surface of the fluid 83 in sump 90 when fluid 83 flows downwardly into sump 87. Further, since pump 88 draws liquid from beneath the surface of the liquid 84 in sump 87, any foam in sump 87 tends to remain on the surface of fluid 84. Consequently, the weir fluid overflow system of the invention minimizes the amount of foam in liquid being returned 45 to the flood. Since the flow of fluid, indicated by arrow V in FIG. 4, is transverse the direction of the flow of fluid indicated by arrows F and G in FIG. 1, the surface fluid flow over weir 86 in the direction of arrow V tends to offset the flow of fluid in the direction of arrows F and G and stabilize the surface of the liquid in the flood.

The width, indicated in FIG. 5 by arrows N, of each segment 80 is 0.75 inch or less, and for pieces of substrate greater than one eighth of an inch thick is preferably 0.25 inch or less.

As earlier noted, shafts 37 are free floating and can be vertically displaced in vertical slots 26 and 27. In each roller 35A, 36A a shaft 37 also bears down against apertures 81 of segments 80 and, along with the weight of segments 80, maintains segments against rollers 13 and 18, respectively. If a shaft 37 was not free floating, but was instead held in a fixed position, such fixed position could position the shaft 37 in the upper part of apertures 81 of a roller 35A, 36A when segments 80 were resting on a roller 13 or 18. This would permit segments 80 to be upwardly displaced until the lower parts of apertures contacted the bottom of a shaft 37. In this kind of "fixed shaft" 37 configuration, the weight of the shaft 37 would not be available to help force segments 80 against a roller 13 or 18, and segments 80 would have to be weighted or sized to insure that the liquid in the flood could not force its way between segments 80 and a roller 13 or 18, lift the segments 80 upwardly from contact with the roller 13 or 18, and escape from the flood. In this respect, larger diameter segments 80 would weigh more and facilitate the maintaining of segments 80 in contact with a roller 13 or 18 (or in contact with a workpiece 82 passing between segments 80 and a roller 13 or 18).

Having described my invention in such terms as to enable those skilled in the art to understand and practise it, and having identified the presently preferred embodiments thereof,

I claim:

1. A dynamic flood conveyor for processing the upper surface of a circuit board substrate by moving the substrate through a body of fluid, said substrate having an upper surface, said conveyor including
   (a) a pair of upstanding spaced apart side walls;
   (b) generally horizontally oriented adjacent parallel support rollers for supporting and transporting said circuit board substrate, said support rollers
      (i) including at least first and second end rollers,
      (ii) each spanning the space between said side walls,
      (iii) each having first and second ends each rotatably mounted in one of said walls, and
      (iv) each having a cylindrical outer surface spanning the space between said side walls, each of the uppermost portions of said cylindrical surfaces of said rollers generally lying in and defining a common generally horizontal imaginary plane;
   (c) means for rotating each of said support rollers in a common direction;
   (d) fluid containment means extending above said horizontal plane and spanning the space between said side walls;
   (e) an upper fluid containment roller spaced apart from said fluid containment means, spanning the space between said side walls, positioned above and generally parallel to said end roller, and including
      (i) a horizontally oriented shaft,
      (ii) a pair of ends each rotatably mounted in one of said side walls,
      (iii) a plurality of cylindrical segments slidably contacting one another and rotatably mounted on said shaft, each of said segments having an aperture formed therethrough which is shaped and dimensioned to permit said segments to be vertically displaced with respect to said shaft and said end roller, said segments extending from one of said side walls to the other of said side walls and positioned above and generally parallel to said end roller and continuously contacting at least one of a second contact pair, said second contact pair comprising
         said cylindrical outer surface of said end roller, and
         the upper surface of said circuit board substrate passing between said fluid containment roller and said end roller,
         selected ones of said segments remaining in contact with said end roller simultaneously with the remaining others of said segments being upwardly displaced with respect to said selected ones of said segments on contacting the upper surface of said circuit board substrate passing between said fluid containment roller and said end roller while moving toward said fluid containment means;
   (f) a reservoir of fluid in said flood conveyor, said fluid reservoir contacting said fluid containment roller and fluid containment means and generally extending
      (i) above said support rollers,
      (ii) between and contacting said fluid containment roller and fluid containment means, and
      (iii) above said imaginary plane,
   (g) means for injecting fluid into said reservoir;
      said fluid containment roller and fluid containment means acting as dams to retain fluid in said reservoir; and,
      said upward displacement of said remaining others of said selected ones of said segments of said fluid containment roller minimizing the fluid escaping from said reservoir over said end roller when said circuit board substrate passes between said fluid containment roller and said end roller into said reservoir.

2. A dynamic flood conveyor for processing a circuit board substrate, said substrate including an upper surface, said conveyor including
   (a) a pair of upstanding spaced apart walls;
   (b) generally horizontally oriented adjacent parallel support rollers for supporting and transporting said circuit board substrate in a first direction of travel, said support rollers
      (i) including an end roller,
      (ii) each spanning the space between said side walls,
      (iii) each having first and second ends each rotatably mounted in one of said walls,
      (iv) each having a cylindrical outer surface spanning the space between said side walls, and
      (v) each having a longitudinal axis circumscribed by said cylindrical outer surface and perpendicular to said first direction of travel;
   (c) means for rotating each of said support rollers in a common direction;
   (d) fluid containment means extending above said horizontal place and spanning the space between side walls;

(e) a fluid containment roller
  (i) spanning the space between said side walls,
  (ii) having a pair of ends each rotatably mounted in one of said side walls, and
  (iii) positioned above and generally parallel to said end roller and continuously contacting at least one of a contact pair, said contact pair comprising
    said cylindrical outer surface of said end roller, and
    the upper surface of said circuit board substrate passing between said upper fluid containment roller and said end roller;
(f) a reservoir of fluid in said flood conveyor, said fluid reservoir
  (i) extending above said support rollers,
  (ii) having a surface extending between and contacting said fluid containment roller and said fluid containment means;
  (iii) experiencing the flow and escape of fluid from said fluid reservoir;
(g) fluid capture and recycling means including
  (i) a weir for drawing fluid from the surface of said reservoir only in a second direction of travel which is transverse said first direction of travel;
  (ii) a first sump positioned underneath said weir to capture fluid escaping from said reservoir,
  (iii) a second sump;
  (iv) means for transferring fluid from said first sump to said second sump sand including
    a first fluid intake positioned beneath the surface level of fluid in said first sump, and
    a first conduit leading from said first fluid intake to a point beneath the surface level of fluid in said second sump;
  (v) pump means for moving fluid from said second sump to said fluid reservoir and including
    a second fluid intake positioned below the surface of fluid in said second sump, and a second conduit leading from said second fluid intake to deliver fluid from said said sump into said fluid reservoir between the surface of said reservoir and said circuit board substrate on said support rollers,
    said delivered fluid moving into said fluid reservoir under laminar flow in only a direction of travel parallel to said first direction of travel.

3. A dynamic flood conveyor for moving a circuit board substrate through a contained body of fluid, said substrate having an upper surface, said flood conveyor including
  (a) a pair of upstanding spaced apart side walls;
  (b) a plurality of generally horizontally oriented adjacent parallel support rollers for supporting and transporting said circuit board substrate, said support rollers
    (i) including an end roller,
    (ii) each spanning the space between said side walls,
    (iii) each having first and second ends each rotatably mounted in one of said walls, and
    (iv) each having a cylindrical outer surface spanning the space between said side walls,
    each of the uppermost portions of said cylindrical surfaces of said rollers generally lying in and defining a common generally horizontal imaginary plane;
  (c) means for rotating each of said support rollers in a common direction;
  (d) fluid containment means extending above said horizontal plane and spanning the space between said side walls;
  (e) a fluid containment roller spaced apart from said fluid containment means, spanning the space between said side walls, positioned above and generally parallel to said end roller, and including
    (i) a horizontally oriented shaft,
    (ii) a pair of ends each rotatably mounted in one of said side walls,
    (iii) a plurality of parallel cylindrical segments slidably contacting one another and rotatably mounted on said shaft, each of said segments having an aperture formed therethrough which is shaped and dimensioned to permit said segment to be vertically displaced with respect to said shaft and said end roller, said segments extending from one of said side walls to the other of said side walls and positioned above and generally parallel to said end roller and continuously contacting at least one of a second contact pair, said second contact pair comprising
      said cylindrical outer surface of said end roller and
      the upper surface of said circuit board substrate passing between said fluid containment roller and said end roller,
      selected ones of said segments remaining in contact with said other of said end roller simultaneously with the remaining others of said segments being upwardly displaced with respect to said selected ones of said segments on contacting the upper surface of said circuit board substrate passing between said fluid containment roller and said end support roller toward said fluid containment means;
  (f) a reservoir of fluid in said flood conveyor, said fluid reservoir contacting said fluid containment roller and generally extending
    (i) above said support rollers,
    (ii) between and contacting said fluid containment roller and fluid containment means, and
    (iii) above said imaginary plane,
  (g) means for injecting fluid into said reservoir;
  said fluid containment roller and fluid containment means acting as dams to retain fluid in said reservoir; and,
  said upward displacements of said remaining others of said segments of said fluid containment roller with respect to said selected ones of said segments of said fluid containment roller minimizing the fluid escaping from said reservoir over said end roller when said circuit board substrate passes between said fluid containment roller and said end roller into said reservoir;
  said shaft being vertically displaceable with respect to said end roller and said segments and downwardly bearing against said apertures of said remaining others of said segments to press said remaining other of said segments against said circuit board substrate passing between said fluid containment roller and said end roller into said reservoir;
  said fluid in said reservoir generating forces pressing said segments away from said fluid containment means.

* * * * *